United States Patent
Priewasser et al.

(10) Patent No.: US 12,243,766 B2
(45) Date of Patent: *Mar. 4, 2025

(54) BACK GRINDING ADHESIVE SHEET, AND METHOD FOR MANUFACTURING SEMICONDUCTOR WAFER

(71) Applicants: DISCO CORPORATION, Tokyo (JP); DENKA COMPANY LIMITED, Tokyo (JP)

(72) Inventors: Karl Heinz Priewasser, Kirchheim b. Muenchen (JP); Tomoya Tsukui, Tokyo (JP); Tomoyuki Kanai, Tokyo (JP); Takeshi Saito, Tokyo (JP)

(73) Assignees: DISCO CORPORATION, Tokyo (JP); DENKA COMPANY LIMITED, Tokyo (JP)

( * ) Notice: Subject to any disclaimer, the term of this patent is extended or adjusted under 35 U.S.C. 154(b) by 857 days.

This patent is subject to a terminal disclaimer.

(21) Appl. No.: 17/434,257

(22) PCT Filed: Feb. 21, 2020

(86) PCT No.: PCT/JP2020/007032
§ 371 (c)(1),
(2) Date: Aug. 26, 2021

(87) PCT Pub. No.: WO2020/175364
PCT Pub. Date: Sep. 3, 2020

(65) Prior Publication Data
US 2022/0148905 A1    May 12, 2022

(30) Foreign Application Priority Data
Feb. 26, 2019   (JP) ................ 2019-032961

(51) Int. Cl.
*B24B 41/06* (2012.01)
*B24B 7/22* (2006.01)
(Continued)

(52) U.S. Cl.
CPC ......... *H01L 21/6836* (2013.01); *B24B 7/228* (2013.01); *B24B 41/06* (2013.01);
(Continued)

(58) Field of Classification Search
CPC ......... B24B 7/228; B24B 37/30; B24B 41/06; C09J 7/22; C09J 7/29; C09J 7/30;
(Continued)

(56) References Cited

U.S. PATENT DOCUMENTS

2017/0062278 A1   3/2017   Priewasser
2017/0130090 A1*  5/2017   Yamamoto ............ C09J 201/00
(Continued)

FOREIGN PATENT DOCUMENTS

JP   2003-064329 A   3/2003
JP   2009141265 A    6/2009
(Continued)

OTHER PUBLICATIONS

Yamagishi, M., et al., "Development of Bump Support Film (BSF) for expanding the size of WLCSP," 2015 IEEE CPMT Symposium Japan (ICSJ): Nov. 9-11, 2015, 4 pages.
(Continued)

*Primary Examiner* — Michael A Tolin
(74) *Attorney, Agent, or Firm* — Christensen O'Connor Johnson Kindness PLLC

(57) ABSTRACT

Provided is a back grinding adhesive sheet which can adequately protect protrusions provided to a semiconductor wafer, and with which back grinding can be adequately performed. The present invention provides a back grinding adhesive sheet for a semiconductor wafer having protru-
(Continued)

sions, the back grinding adhesive sheet comprising a non-adhesive cushion layer, and an adhesive layer provided on the cushion layer. The adhesive layer has an opening with a smaller diameter than the diameter of the semiconductor wafer, and the outer edge of the semiconductor wafer is adhered to the adhesive layer such that the protrusions on the semiconductor wafer are positioned inside the opening. The protrusions are protected by the cushion layer when the semiconductor wafer is in the state of being adhered to the adhesive layer. The adhesive sheet satisfies at least one of the following conditions (1)-(2). (1) When the cushion layer is cut out using the dumbbell from JISZ1702 and is stretched 25% at a gauge length of 40 mm and a tensile speed of 300 mm/min, the tensile stress is 2-30N/10 mm. (2) The cushion layer is formed from a thermoplastic resin that has a melt flow rate (JISK7210, 125° C./10.0 kg load) of 0.2-30 g/10 min, and a melting point of 60-110° C.

13 Claims, 6 Drawing Sheets

(51) Int. Cl.
C09J 7/29 (2018.01)
C09J 7/38 (2018.01)
H01L 21/02 (2006.01)
H01L 21/683 (2006.01)

(52) U.S. Cl.
CPC ............ *C09J 7/29* (2018.01); *C09J 7/387* (2018.01); *H01L 21/02013* (2013.01); *H01L 21/02016* (2013.01); *C09J 2203/326* (2013.01); *C09J 2301/204* (2020.08); *C09J 2301/414* (2020.08); *C09J 2301/502* (2020.08); *C09J 2423/046* (2013.01); *C09J 2425/006* (2013.01); *C09J 2453/00* (2013.01); *H01L 2221/68386* (2013.01)

(58) Field of Classification Search
CPC .... C09J 7/387; C09J 201/00; C09J 2203/326; C09J 2301/122; C09J 2301/204; C09J 2301/312; C09J 2301/414; C09J 2301/502; C09J 2423/046; C09J 2425/006; C09J 2453/00; H01L 21/02013; H01L 21/02016; H01L 21/304; H01L 21/6835; H01L 21/6836; H01L 2221/68318; H01L 2221/68327; H01L 2221/6834; H01L 2221/68381; H01L 2221/68386

See application file for complete search history.

(56) References Cited

U.S. PATENT DOCUMENTS

| | | |
|---|---|---|
| 2018/0247870 A1 | 8/2018 | Priewasser |
| 2018/0337141 A1 | 11/2018 | Priewasser |

FOREIGN PATENT DOCUMENTS

| | | | | |
|---|---|---|---|---|
| JP | 2010056409 A | 3/2010 | | |
| JP | 2011216513 A | 10/2011 | | |
| JP | 2013004872 A | 1/2013 | | |
| JP | 2013-211438 A | 10/2013 | | |
| JP | 2013-243233 A | 12/2013 | | |
| JP | 2014173027 A | 9/2014 | | |
| JP | 2017-050536 A | 3/2017 | | |
| JP | 2018006540 A | 1/2018 | | |
| JP | 2018-526826 A | 9/2018 | | |
| JP | 2018-195805 A | 12/2018 | | |
| JP | 2019-065168 A | 4/2019 | | |
| TW | 201606869 A | 2/2016 | | |
| WO | 2012165551 A1 | 12/2012 | | |
| WO | WO-2016063917 A1 * | 4/2016 | ............ | B32B 27/00 |
| WO | WO-2018181240 A1 * | 10/2018 | ............ | C09J 201/00 |

OTHER PUBLICATIONS

First Office Action mailed Nov. 21, 2022, issued in corresponding Chinese Application No. 202080006585.1, filed Feb. 21, 2020, 12 pages.

International Search Report mailed Mar. 31, 2020, issued in corresponding International Application No. PCT/JP2020/007032, filed Feb. 21, 2020, 3 pages.

* cited by examiner

BACK GRINDING ADHESIVE SHEET, AND METHOD FOR MANUFACTURING SEMICONDUCTOR WAFER

TECHNICAL FIELD

The present invention relates to an adhesive sheet for back grinding and a method for manufacturing semiconductor wafers using the same.

BACKGROUND ART

When semiconductor wafers are processed, adhesive sheets are attached to the wafers to protect them from damage. For example, during back grinding processes for the semiconductor wafer, the adhesive sheet is attached to the wafer to protect a pattern surface thereof. The adhesive sheet is required to have followability to follow unevenness of the pattern surface (bump followability) in terms of adhesiveness to uneven pattern surfaces such as protruding electrodes (bumps) and reliability of pattern surface protection.

As an adhesive sheet having the followability, adhesive sheets with a thicker adhesive or a flexible resin layer with cushioning properties between a base film and an adhesive are common in the market. However, in the case of a pattern surface with rough unevenness, risks of insufficient followability and adhesive residue increase.

Patent Document 1 discloses an adhesive sheet including a base material sheet, a non-adhesive part and an adhesive part, in which one side of the base material sheet has the non-adhesive part with a diameter smaller than an outer diameter of a semiconductor wafer to be attached and the adhesive part surrounding the non-adhesive part, and adhesive strength of the adhesive part at 23° C. is 500 mN or more to prevent adhesive residue and to prevent deterioration of protective function.

PRIOR ART DOCUMENT

Patent Document

Patent Document 1: JP2013-211438A

SUMMARY OF INVENTION

Technical Problem

In the configuration of Patent Document 1, back grinding of the semiconductor wafer is performed in a state where only tips of the protruding electrodes of the semiconductor wafer are in contact with the base sheet, which may cause damage to the protruding electrodes due to excessive load applied to the protruding electrodes during the back grinding.

The present invention was made in consideration of these circumstances. The purpose of the present invention is to provides an adhesive sheet for back grinding capable of protecting convex portions of a semiconductor wafer properly and preforming the back grinding properly.

Solution to Problem

According to the present invention, there is provided an adhesive sheet for back grinding of a semiconductor wafer having convex portions, including a non-adhesive cushion layer and an adhesive layer provided on the cushion layer, in which the adhesive layer includes an opening with a diameter smaller than a diameter of the semiconductor wafer, the adhesive layer is configured to be attached to an outer periphery of the semiconductor wafer so that the convex portions of the semiconductor wafer are placed in the opening, whereby the convex portions are protected by the cushion layer in a state where the semiconductor wafer is attached to the adhesive layer, and at least one of the following conditions (1) and (2) is satisfied:
(1) tensile stress of the cushion layer punched out by using a dumbbell according to JISZ1702 is 2 to 30N/10 mm when the punched-out cushion layer is stretched by 25% at a distance between gauge lines of 40 mm and a tensile speed of 300 mm/min; and
(2) the cushion layer is composed of a thermoplastic resin with a melt flow rate (JISK7210, 125° C./10.0 kg load) of 0.2 to 30 g/10 min and a melting point of 60 to 110° C.

The present inventors conducted a thorough investigation and found that it is possible to properly protect the convex portions on the semiconductor wafer and perform the back grinding by setting the tensile stress of the cushion layer of the adhesive sheet to the above ranges or by setting MFR and viscosity of the thermoplastic resin constituting the cushion layer of the adhesive sheet to the above ranges, and by performing the back grinding in a state where the adhesive layer is attached to an outer periphery of the semiconductor wafer so that the convex portions of the semiconductor wafer are placed in the opening and the convex portions of the semiconductor wafer are protected by the cushion layer.

The following are examples of various embodiments of the present invention. The embodiments shown below can be combined with each other.

Preferably, there is provided the adhesive layer, in which the convex portions are protected by being embedded in the cushion layer.

Preferably, there is provided the adhesive layer, in which the adhesive layer is adhered to the semiconductor wafer under reduced pressure.

Preferably, there is provided the adhesive layer, in which thickness of the cushion layer is 50 to 300 μm and thickness of the adhesive layer is 1 to 100 μm.

Preferably, there is provided the adhesive layer, in which the adhesive sheet is used in a state where a curable resin and a support film are laminated onto a cushion layer side of the adhesive sheet.

Preferably, there is provided the adhesive layer, in which the curable resin has a viscosity of 100 to 3,000 mPa·s before curing and Shore D hardness of 5 to 72 after curing.

Preferably, there is provided the adhesive layer, in which when height of the convex portion 5 is Td (μm), thickness of the curable resin is (Td+20) to (Td+200) μm.

Preferably, there is provided the adhesive sheet, in which the adhesive sheet includes: a curable resin layer containing the curable resin; and the support film, in which the curable resin layer is provided on an opposite side of a surface of the adhesive sheet provided with the adhesive layer and between the support film and a surface of the cushion layer.

Preferably, there is provided the adhesive sheet, in which the adhesive sheet includes a cured resin layer so as to surround the curable resin layer.

Preferably, there is provided a method for manufacturing a semiconductor wafer using the adhesive sheet, including a frame adhering process, a wafer adhering process, a cutting process, a resin curing process, a grinding process, and a peeling process, in which in the frame adhering process, the adhesive sheet is adhered to a ring frame, in the wafer adhering process, the adhesive sheet is adhered to a surface of the semiconductor wafer having the convex portions on a periphery of the semiconductor wafer under reduced pressure, in the cutting process, the adhesive sheet is cut along the periphery of the semiconductor wafer, in the resin curing process, the curable resin is cured in a state where the cushion layer is in contact with the curable resin, in the grinding process, a backside of the semiconductor wafer is ground, in the peeling process, the adhesive sheet is peeled off from the semiconductor wafer, and at least one of the following conditions (A) and (B) is satisfied:

(A) the above condition is satisfied (1); and (B) the above condition (2) is satisfied, the method further includes a heating process, and in the heating process, the cushion layer is heated to 60 to 150° C.

Preferably, there is provided the method for manufacturing the semiconductor wafer, in which tensile stress of the cushion layer punched out by using a dumbbell according to JISZ1702 is 2 to 30 N/10 mm when the punched-out cushion layer is stretched by 25% at a distance between gauge lines of 40 mm and a tensile speed of 300 mm/min.

Preferably, there is provided the method for manufacturing the semiconductor wafer, in which the curable resin has a viscosity of 100 to 3,000 mPa·s before curing and Shore D hardness of 5 to 72 after curing.

Preferably, there is provided the method for manufacturing the semiconductor wafer, in which the method includes a pressing process between the wafer adhering process and the resin curing process, in which, in the pressing process, the curable resin is pressed and spread by moving the adhesive sheet while the adhesive sheet faces the curable resin supplied on the support film.

DESCRIPTION OF EMBODIMENTS

Figure 1A:
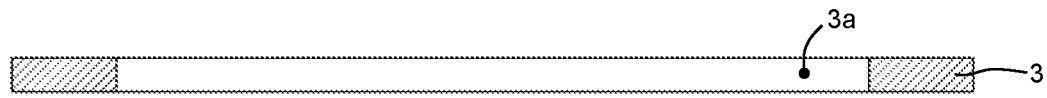
FIGS. 1A to 1D show cross-sectional views for illustrating a method for manufacturing a semiconductor wafer using an adhesive sheet 10 of the first and third embodiments of the present invention.

Embodiments of the present invention will be described. Various features shown in the following embodiments can be combined with each other. In addition, the invention can be made independently for each feature.

1. First Embodiment 1-1. Adhesive Sheet

Adhesive sheet 10 of the first embodiment of the present invention will be described using FIGS. 1A to 2E. The adhesive sheet 10 of this embodiment is an adhesive sheet for back grinding of a semiconductor wafer having convex portions, and is a "non-heated" type that is intended to be used without heating. The adhesive sheet 10 of this embodiment has a non-adhesive cushion layer 1 and an adhesive layer 2 provided on the cushion layer 1, and is used for grinding a backside 4b of a semiconductor wafer 4 having convex portions 5. Preferably, this adhesive sheet 10 is used in a state where a curable resin 8 and a support film 7 are laminated onto a cushion layer 1 side of the adhesive sheet 10. Each configuration will be described below.

Cushion Layer 1

The cushion layer 1 is a layer for protecting the convex portions 5 of the semiconductor wafer 4, and is preferably configured to have tensile stress of 2 to 30 N/10 mm. When the tensile stress is 2 N/10 mm or more, handling performance of the adhesive sheet 10 becomes good. When the tensile stress is 30 N/10 mm or less, the convex portions 5 of the semiconductor wafer 4 are easily embedded in the cushion layer 1, and the convex portions 5 can be properly protected. The tensile stress of the cushion layer 1 is preferably 3 to 15 N/10 mm. The tensile stress means tensile stress when the cushion layer 1 punched out by using a dumbbell according to JISZ1702 is stretched by 25% at a distance between gauge lines of 40 mm and a tensile speed of 300 mm/min.

Thickness of the cushion layer 1 is preferably 50 to 300 µm, and more preferably 50 to 100 µm.

The cushion layer 1 is preferably composed of thermoplastic resin. The constituent of the thermoplastic resin may be: ionoma resins in which carboxyl groups of single material such as ethylene-methacrylic acid-acrylic ester ternary copolymer, ethylene-methacrylic acid copolymer, and ethylene-acrylic acid copolymer and/or composite material thereof are cross-linked with metal ions such as sodium ions, lithium ions and magnesium ions; soft polypropylene resins blended with styrene-butadiene copolymer rubber, styrene-butadiene styrene block copolymer rubber, styrene-isoprene-styrene block copolymer rubber, ethylene-propylene rubber or the like; polyurethane; low density polyethylene; ethylene-propylene block copolymer; ethylene-propylene random copolymer; ethylene-vinyl acetate copolymer; ethylene-methacrylic acid copolymer; ethylene-1 octene copolymer; ethylene-styrene copolymer; ethylene-styrene-diene copolymer; or polybutene, but is not limited thereto. Among them, the ethylene-styrene copolymer is preferred.

Mass average molecular weight (Mw) of the thermoplastic resin is preferably 10,000 to 1,000,000, and more preferably 30,000 to 500,000. The mass average molecular weight (Mw) is a polystyrene-equivalent value measured by gel permeation chromatography (GPC) under the measurement conditions described below.

Equipment name: SYSTEM-21 Shodex (manufactured by Showa Denko K.K.)
Column: Three PL gel MIXED-B columns in series
Temperature: 40° C.
Detection: Differential refractive index
Solvent: Tetrahydrofuran
Concentration: 2 mass %
Calibration curve: Standard polystyrene (PS) (manufactured by Polymer Laboratories Inc.) was used to prepare the calibration curve.

Adhesive Layer 2

The adhesive layer 2 is a layer for adhering the adhesive sheet 10 to the semiconductor wafer 4, and is composed of adhesives. The adhesive layer 2 has an opening 2a with a diameter smaller than the diameter of the semiconductor wafer 4. In other words, the adhesive layer 2 has a ring shape. The opening 2a is an area where no adhesive is provided and has a diameter smaller than the diameter of the semiconductor wafer 4. The diameter of the opening 2a/diameter of the semiconductor wafer 4 is preferably 0.950 to 0.995, more preferably 0.960 to 0.990.

The adhesive layer 2 is adhered to an outer periphery 4a of the semiconductor wafer 4 so that the convex portions 5 of the wafer 4 are placed in the opening 2a. As a result, the convex portions 5 is not in contact with the adhesive, and adhesive residue on the convex portions 5 is prevented.

Width of the adhesive layer 2 is preferably 10 to 100 mm, more preferably 30 to 70 mm. Thickness of the adhesive layer 2 is preferably 1 to 100 μm, more preferably 5 to 50 μm.

The constituent of the adhesive can includes: 2-Hydroxyethyl (meth)acrylate, 2-hydroxypropyl (meth)acrylate, 2-hydroxybutyl (meth)acrylate and the like with hydroxyl groups as (meth)acrylic monomer or monomer containing functional groups such as butyl (meth)acrylate, 2-butyl (meth) acrylate, t-butyl (meth)acrylate, pentyl (meth)acrylate, octyl (meth)acrylate, 2-ethylhexyl (meth)acrylate, nonyl (meth) acrylate decyl (meth)acrylate, lauryl (meth)acrylate, methyl (meth)acrylate, ethyl (meth)acrylate, isopropyl (meth)acrylate, tridecyl (meth)acrylate, myristyl (meth)acrylate, cetyl (meth)acrylate, stearyl (meth)acrylate, cyclohexyl (meth) acrylate, benzyl (meth)acrylate, dimethyl acrylamide, diethyl acrylamide, acryloyl morpholine and isobornyl acrylate; (meth)acrylic acid, crotonic acid, maleic acid, itaconic acid, fumaric acid, acrylamide N-glycolic acid, cinnamic acid and the like with carboxyl groups; and allyl glycidyl ether, (meth)acrylic acid glycidyl ether and the like with epoxy groups, but are not limited thereto. The adhesive contains preferably a curing agent. The curing agents include polyfunctional isocyanate curing agents and polyfunctional epoxy curing agents. When the curing agent reacts with the functional group, cross-linked structures with the functional groups as base points are formed, which increases cohesive strength of the adhesive and suppresses adhesive residue. In addition, (meth)acrylate with one or more (meth)acroylated ends or side chains of oligomer/polymer such as 1,2-polybutadiene-terminated urethane (meth)acrylate, hydrogenated product thereof, 1,4-polybutadiene-terminated urethane (meth)acrylate, polyisoprene-terminated (meth)acrylate, polyester-based urethane (meth) acrylate, polyether-based urethane (meth)acrylate, polyester (meth)acrylate, bis-A epoxy (meth)acrylate may be used.

The adhesive layer 2 can be formed by coating the adhesive on the cushion layer 1 or by applying it on release films and then transferring it to the cushion layer 1, for example, by coating methods such as general comma coating, gravure coating, roll coating and screen coating.

Semiconductor Wafer 4

The semiconductor wafer 4 has convex portions 5. The convex portions 5 have any structures that protrude in the out-of-plane direction of the semiconductor wafer 4. An example of the convex portions 5 is protruding electrodes or convex portions of a circuit with concavity and convexity.

The semiconductor wafer 4 includes not only a silicon wafer but also a germanium wafer, a gallium-arsenide wafer, a gallium-phosphorus wafer, a gallium-arsenide aluminum wafer. Diameter of the semiconductor wafer 4 is preferably 1 to 16 inches, more preferably 4 to 12 inches. Thickness of the semiconductor wafer 4 is preferably 500 to 800 μm, more preferably 520 to 775 μm, but is not limited thereto.

Height of the convex portion 5 is preferably 10 to 500 μm, more preferably 100 to 300 μm. The convex portions 5 are preferably formed by solder.

The semiconductor wafer 4 has preferably an outer periphery 4a in which the convex portions 5 are not provided. Width of the outer periphery 4a is preferably 1.0 to 3.0 mm, more preferably 1.5 to 2.5 mm.

Final products using the semiconductor wafers 4 having the convex portions 5 include electronic components for logic, memory, sensor, power supply, etc.

Curable resin 8

The curable resin 8 is a resin that is hardened by stimuli such as energy rays (e.g., ultraviolet rays) or heat. The curable resin 8 is placed between the cushion layer 1 and the support film 7.

The curable resin 8 has a viscosity of 100 to 3,000 mPa·s, preferably 200 to 1,000 mPa·s before curing. When the viscosity is 100 mPa-s or more, a surface contact (not point contact) of the curable resin 8 prevents air bubbles from entering during a pressing process, resulting in excellent grindability. When the viscosity is 3000 mPa-s or less, the curable resin 8 is less likely to entrap air bubbles when it flows between the convexe 5 and the adjacent convexe 5, resulting in excellent grindability. The viscosity is measured using an E-type viscometer under the conditions of 23° C. and 50 rpm.

The curable resin 8 has preferably Shore D hardness of 5 to 72, more preferably 5 to 70, even more preferably 10 to 60 after curing. When the Shore D hardness is 5 or more, retentivity to retain the convex portions 5 is higher, resulting in excellent grindability. When the Shore D hardness is 72 or less, it is easy to bend the adhesive sheet 10 when peeling the adhesive sheet 10 from the semiconductor wafer 4. The Shore D hardness is measured under the conditions in accordance with JIS K 6253.

The curable resin 8 is preferably light curable resin, more preferably UV curable resin.

The curable resin 8 is preferably based on an acrylic resin. The constituent of the curable resin 8 include, for example, butyl (meth)acrylate, 2-butyl (meth)acrylate, t-butyl (meth) acrylate, pentyl (meth)acrylate, octyl (meth)acrylate, 2-ethylhexyl (meth)acrylate, nonyl (meth)acrylate, decyl (meth) acrylate, lauryl (meth)acrylate, methyl (meth)acrylate, ethyl (meth)acrylate, isopropyl (meth)acrylate, tridecyl (meth) acrylate, myristyl (meth)acrylate, cetyl (meth)acrylate, stearyl (meth)acrylate, cyclohexyl (meth)acrylate, benzyl (meth)acrylate, dimethylacrylamide, diethylacrylamide, acryloyl morpholine, isobornyl acrylate, 2-hydroxyethyl (meth)acrylate, 2-hydroxypropyl (meth)acrylate, 2-hydroxybutyl (meth)acrylate, (meth) acrylic acid, crotonic acid, maleic acid, itaconic acid, fumaric acid, acrylamide N-glycolic acid, cinnamic acid, allyl glycidyl ether, (meth) acrylate glycidyl ether, dimethylacrylamide, diethylacrylamide, acryloyl morpholine, isobornyl acrylate.

Furthermore, bifunctional (meth)acrylate monomers includes 1,3-butylene glycol di(meth)acrylate, 1,4-butanediol di(meth)acrylate, 1,6-hexadiol di(meth)acrylate, 1,9-nonanediol di(meth)acrylate, neopentyl glycol di(meth)acrylate, dicyclopentanyl di(meth)acrylate, 2-ethyl-2-butyl-propanediol di(meth)acrylate, neopentyl glycol modified trimethylolpropane di(meth)acrylate, stearic acid modified pentaerythritoldiacrylate, polypropylene glycol di(meth)acrylate, 2,2-bis(4-(meth)acryloxydiethoxyphenyl)propane, 2,2-bis(4-(meth)acryloxypropoxyphenyl)propane, 2,2-bis(4-(meth)acryloxytetraethoxyphenyl) propane. Trifunctional (meth)acrylate monomers, includes tomethylolpropane tri(meth)acrylate, tris[(meth)acryloxyethyl] isocyanurate. (Meth)acrylate monomers with 4 or more functionalities include dimethylolpropane tetra(meth)acrylate, pentaerythritol tetra(meth)acrylate, pentaerythritol ethoxytetra(meth)acrylate, dipentaerythritol penta(meth)acrylate, dipentaerythritol hexa(meth)acrylate.

Furthermore, (meth)acrylate with one or more (meth)acroylated ends or side chains of oligomer/polymer such as 1,2-polybutadiene-terminated urethane (meth)acrylate, hydrogenated product thereof, 1,4-polybutadiene-terminated urethane (meth)acrylate, polyisoprene-terminated (meth)acrylate, polyester-based urethane (meth)acrylate, polyether-based urethane (meth)acrylate, polyester (meth) acrylate, bis-A epoxy (meth)acrylate may be used. Among them, curable resins containing 1,2-hydrogenated polybutadiene terminal urethane (meth)acrylate, isobornyl acrylate, and diethylacrylamide are preferred because they can improve the adhesion between the cushion layer 1 and the support film 7.

Curing shrinkage of the curable resin 8 is preferably 7% or less.

When height of the convex portion 5 is Td (µm), thickness of the curable resin 8 is preferably (Td+20) to (Td+200) µm, more preferably (Td+50) to (Td+150) µm.

Support Film 7

The support film 7 may be any film that can support the curable resin 8 and can be made of polyolefins such as ethylene vinyl acetate, polyethylene, polypropylene, polybutene and polybutadiene as well as polyvinyl chloride, polyethylene terephthalate, polyethylene naphthalate, polystyrene, polycarbonate, polyimide or the like.

Thickness of the support film 7 is preferably 10 to 300 µm, more preferably 30-250 µm.

1-2. Method for Manufacturing Semiconductor Wafer

FIGS. 1A to 2E illustrate a method for manufacturing a semiconductor wafer using the adhesive sheet 10. This method includes a frame adhering process, a wafer adhering process, a cutting process, a pressing process, a resin curing process, a grinding process, and a peeling process. The order in which these processes are performed is not limited thereto, and the order can be swapped as appropriate. Each process is described below.

Frame Adhering Process

Figure 1B:
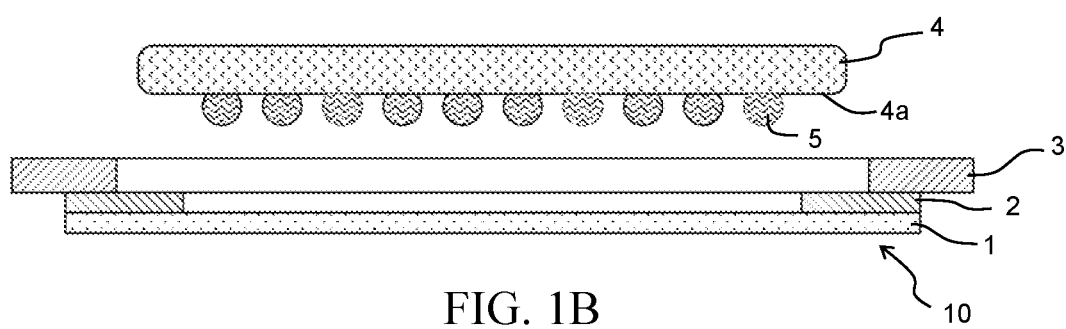

As shown in FIGS. 1A and 1B, in the frame adhering process, the adhesive sheet 10 is adhered to the ring frame 3. The ring frame 3 has an opening 3a with a diameter larger than the diameter of the opening 2a of the adhesive layer 2, and the ring frame 3 can be adhered to the adhesive layer 2. This allows the adhesive sheet 10 to be held stably in the ring frame 3, making it easier to handle the adhesive sheet 10.

Wafer Adhering Process

Figure 1C:
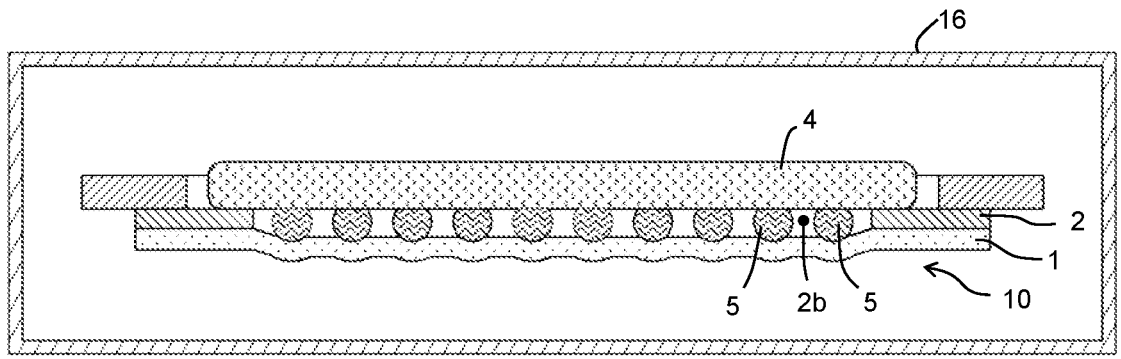

As shown in FIGS. 1B and 1C, in the wafer adhering process, the adhesive sheet 10 is adhered to the outer periphery 4a of the wafer 4 under reduced pressure so that the adhesive sheet 10 is in contact with the surface with the convex portions 5 of the semiconductor wafer 4. Width of the adhering surface where the adhesive layer 2 is adhered to the semiconductor wafer 4 is preferably 1.0 to 3.0 mm, more preferably 1.5 to 2.5 mm.

This process can be performed by adhering the adhesive sheet 10 to the semiconductor wafer 4 in a decompression chamber 16. Pressure in the decompression chamber 16 should be lower than atmospheric pressure, preferably 50 kPa or less, more preferably 10 kPa or less, even more preferably 1 kPa or less. Lower limit of the pressure in the decompression chamber 16 is, for example, 10 Pa, but is not limited thereto.

By adhering the adhesive sheet 10 to the semiconductor wafer 4 under the reduced pressure in this way, sealed spaces 2b enclosed by the semiconductor wafer 4 and the adhesive sheet 10 becomes depressurized state.

Figure 1D:
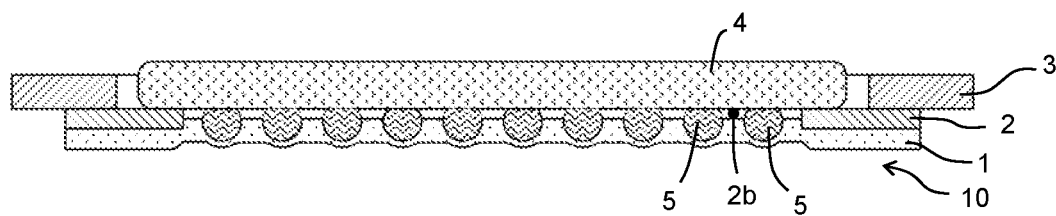

In that state, when the adhesive sheet 10 adhered to the semiconductor wafer 4 is moved from the decompression chamber 16 and exposed to atmospheric pressure, the cushion layer 1 is pushed by the atmospheric pressure into the sealed spaces 2b, as shown in FIG. 1D. As a result, the convex portions 5 are embedded in the cushion layer 1, and the convex portions 5 are protected by the cushion layer 1. The ratio of height of the embedded part of the convex portion 5/height of the entire convex portion 5 is preferably 0.2 to 1, more preferably 0.5 to 1, even more preferably 0.8 to 1.

Cutting Process

Figure 2A:
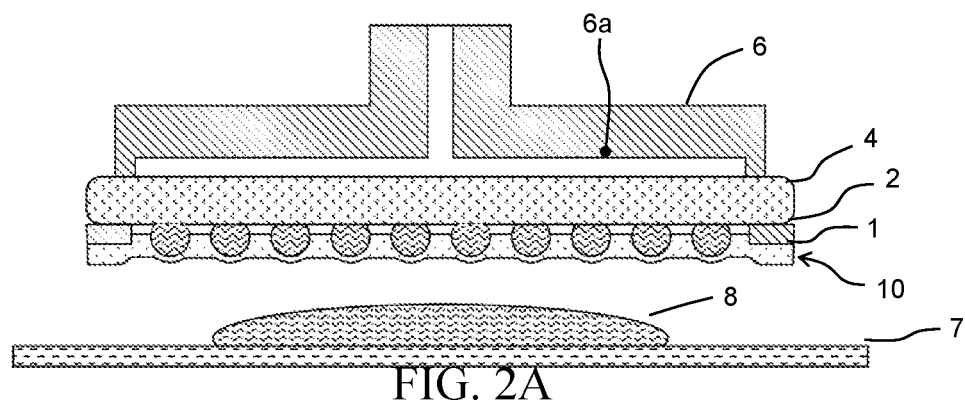
FIGS. 2A to 2E show cross-sectional views for illustrating the method for manufacturing the semiconductor wafer using the adhesive sheet 10 of the first and third embodiments of the present invention.

As shown in FIGS. 1D and 2A, in the cutting process, the adhesive sheet 10 is cut along the periphery of the semiconductor wafer 4. As a result, the adhesive sheet 10 adhered to the semiconductor wafer 4 is separated from the ring frame 3.

Pressing Process

Figure 2B:
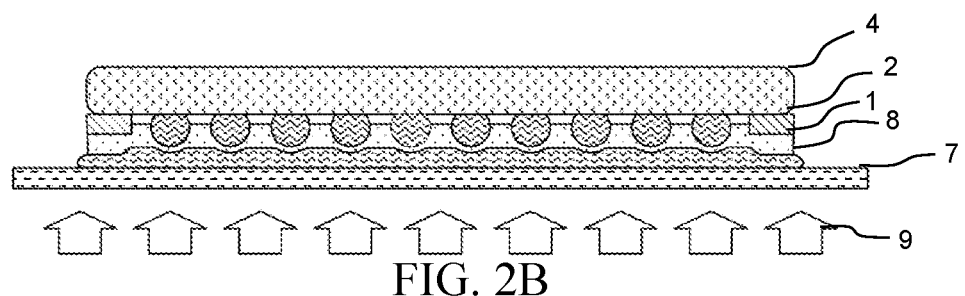

As shown in FIGS. 2A and 2B, in the pressing process, the curable resin 8 is pressed and spread by moving the adhesive sheet 10 in a state where the adhesive sheet 10 faces the curable resin 8 supplied on the support film 7.

In an example, the semiconductor wafer 4 is adsorbed on the decompression unit 6 having a decompression hole 6a, and the adhesive sheet 10 is pressed against the curable resin 8 in that state. In that state, the curable resin 8 is pressed and spread by moving the adhesive sheet 10 along the surface of the support film 7.

Resin Curing Process

Figure 2C:
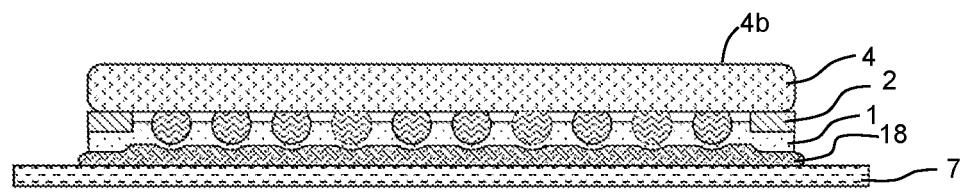

As shown in FIGS. 2B and 2C, in the resin curing process, the curable resin 8 is cured in a state where the cushion layer 1 is placed in contact with the curable resin 8.

In an example, the curable resin 8 can be cured by irradiating energy rays 9 such as ultraviolet rays through the support film 7. This allows the adhesive sheet 10 to be held stably on the support film 7.

Grinding Process

Figure 2D:
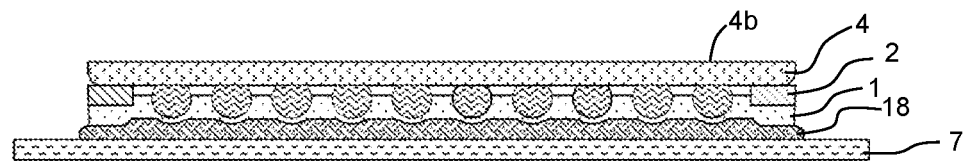

As shown in FIGS. 2C and 2D, the grinding process involves grinding the backside 4b of the semiconductor wafer 4.

The backside 4b of the semiconductor wafer 4 is an opposite surface to the surface on which the convex portions 5 are provided. There are no restrictions on methods for grinding the backside of the wafer, and any known grinding method can be used. The grinding is preferably performed while water is applied to the wafer and a grinding wheel (e.g., diamond wheel) to cool them down. Thickness of the wafer made thinner by the grinding is preferably 300 µm or less, more preferably 50 µm or less.

During back grinding, the convex portions 5 are easily damaged because an in-plane directional load of the semiconductor wafer 4 is applied to the convex portions 5. However, in this embodiment, since at least some convex portions 5 are embedded in the cushion layer 1 and the hardened curable resin 8, the convex 5 is hardly damaged because the convex portions 5 are stably supported by the cushion layer 1 and the hardened curable resin 8. The curable resin 8 can be omitted. In such a case, the convex portions 5 are supported by the cushion layer 1.

Peeling Process

Figure 2E:
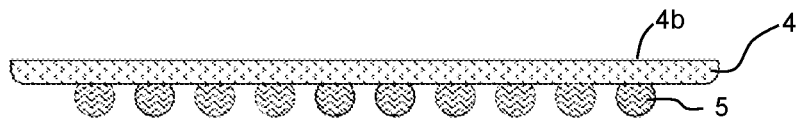

As shown in FIGS. 2D and 2E, in the peeling process, the adhesive sheet 10 is peeled off from the semiconductor wafer 4. The peeling of the adhesive sheet 10 can be performed by curving the adhesive sheet 10 in the direction in which the sheet 10 moves away from the semiconductor wafer 4.

This completes the back grinding process of the semiconductor wafer 4. When the back grinding is performed using an adhesive sheet in such a form that the convex portions 5 are in contact with the adhesive, the adhesive may adhere to the convex portions 5. However, in this embodiment, adhesion of the adhesive to the convex portions 5 is suppressed because the convex portions 5 are not in contact with the adhesive layer 2.

2. Second Embodiment

2-1. Adhesive Sheet

Figure 3:
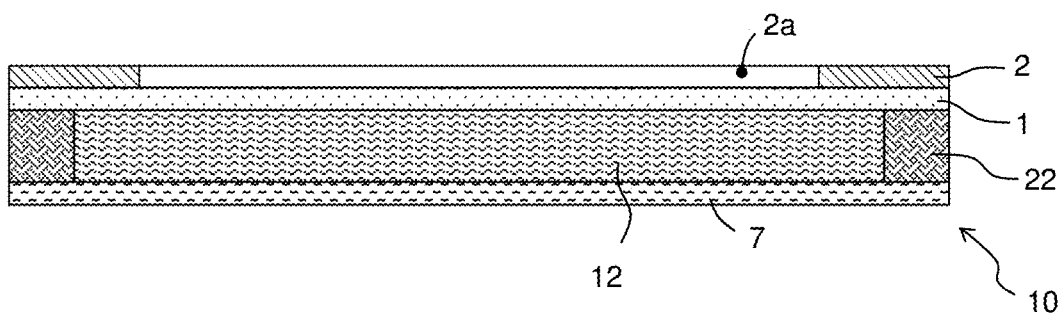
FIG. 3 shows a cross-sectional view of an adhesive sheet 10 of the second and fourth embodiments of the present invention.

In the first embodiment, the adhesive sheet 10 includes the cushion layer 1 and the adhesive layer 2. In the second embodiment, as shown in FIG. 3, the adhesive sheet 10 further includes a curable resin layer 12 and the support film 7.

The curable resin layer 12 is in an uncured state and is the same as the curable resin of the first embodiment. The support film 7 is the same as the support film 7 of the first embodiment. An annular cured resin layer 22 is provided around the curable resin layer 12. The cured resin layer 22 can be formed by curing the curable resin. Assuming that the height of the convex portion 5 is Td (μm), each thickness of the curable resin layer 12 and the cured resin layer 22 is preferably (Td+20) to (Td+200) μm, more preferably (Td+50) to (Td+150) μm.

Figure 4A:
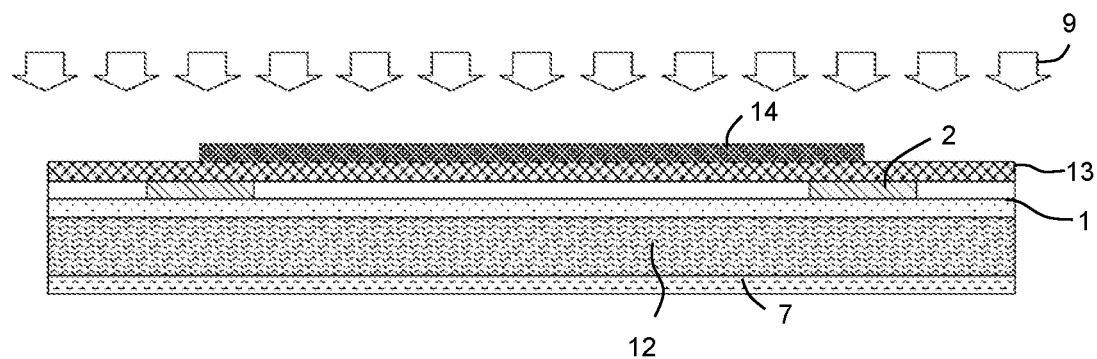
FIGS. 4A to 4C show cross-sectional views for illustrating a method for manufacturing the adhesive sheet 10 of the second and fourth embodiments of the present invention.
Figure 4B:
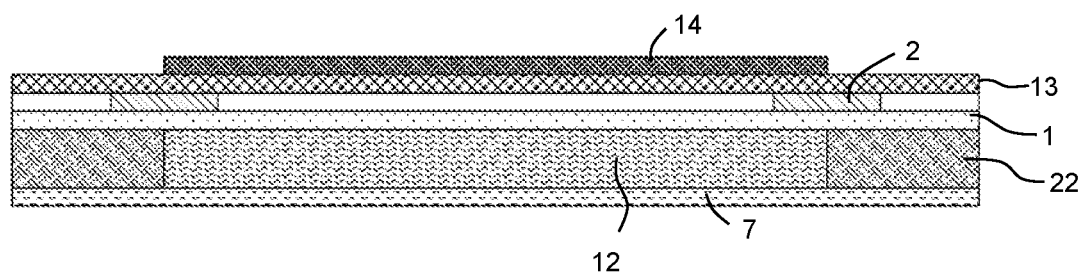

A method for manufacturing the adhesive sheet 10 of this embodiment will be described using FIGS. 4A to 4C. First, as shown in FIG. 4A, a laminate is formed by laminating the curable resin layer 12, cushion layer 1, adhesive layer 2, and a release liner 13 on the support film 7 in this order. The release liner 13 is used to protect the adhesive layer 2 and is peeled off in use of the adhesive sheet 10. A mask 14 is used to shield energy rays in an area covered by the mask 14.

Second, the mask 14 is placed on the release liner 13, and the energy rays 9 are irradiated to the curable resin layer 12 through the mask 14. The mask 14 is used to shield the energy rays 9 in the area covered by the mask 14. As shown in FIG. 4b, the curable resin layer 12 cures in the area not covered by the mask 14 to become the cured resin layer 22. The support film 7 is bonded to the cushion layer 1 via the cured resin layer 22. The curable resin layer 12 is provided in the space surrounded by the support film 7, the cured resin layer 22, and the cushion layer 1. The mask 14 may be placed on the support film 7, and the energy rays 9 may be irradiated from the support film 7 side.

Figure 4C:
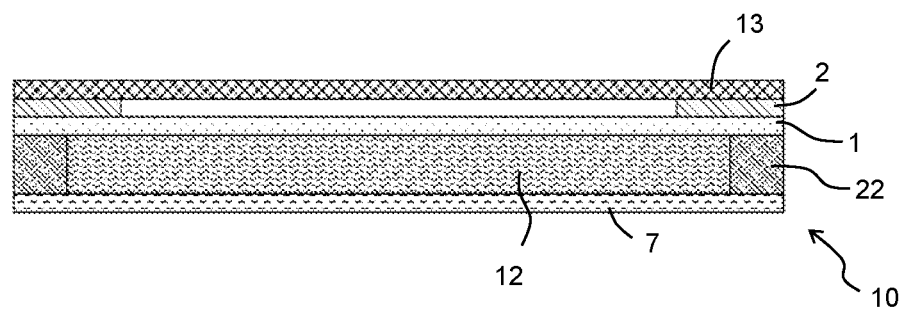

Third, as shown in FIG. 4C, the adhesive sheet 10 of this embodiment is obtained by cutting the laminate along the periphery of the adhesive layer 2.

2-2. Method for Manufacturing Semiconductor Wafer

A method for manufacturing the semiconductor wafers using the adhesive sheet 10 of this embodiment will be described using FIGS. 5A to 6D. This manufacturing method includes a frame adhering process, a wafer adhering process, a resin curing process, a cutting process, a grinding process, and a peeling process. The order in which these processes are performed is not limited thereto, and the order can be swapped as appropriate. Each process will be described below. In the following explanation, the explanations in common with the first embodiment are not repeated.

Frame Adhering Process

Figure 5A:
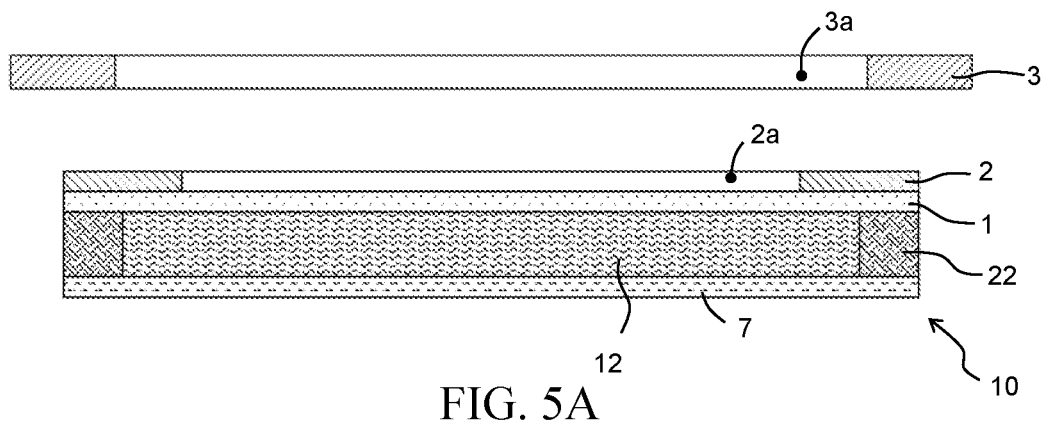
FIGS. 5A to 5D show cross-sectional views for illustrating the method for manufacturing the semiconductor wafer using the adhesive sheet 10 of the second and fourth embodiments of the present invention.
Figure 5B:
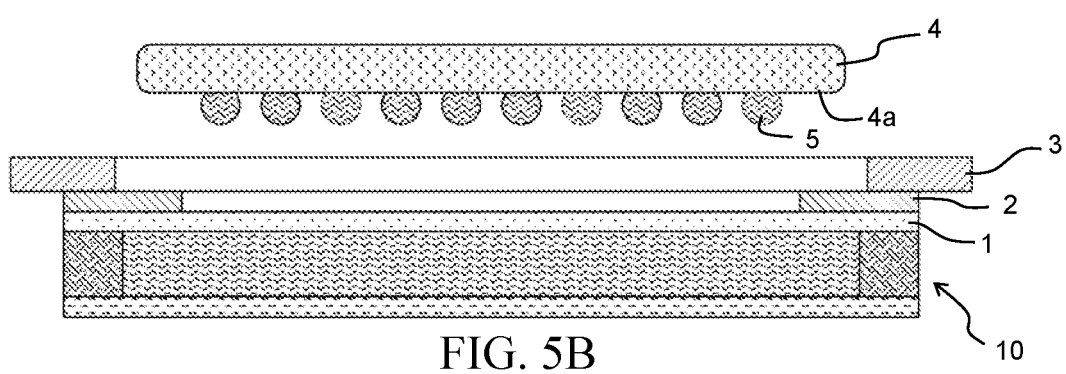

As shown in FIGS. 5A to 5B, in the frame adhering process, the adhesive sheet 10 is adhered to the ring frame 3 as in the first embodiment.

Wafer Adhering Process

Figure 5C:
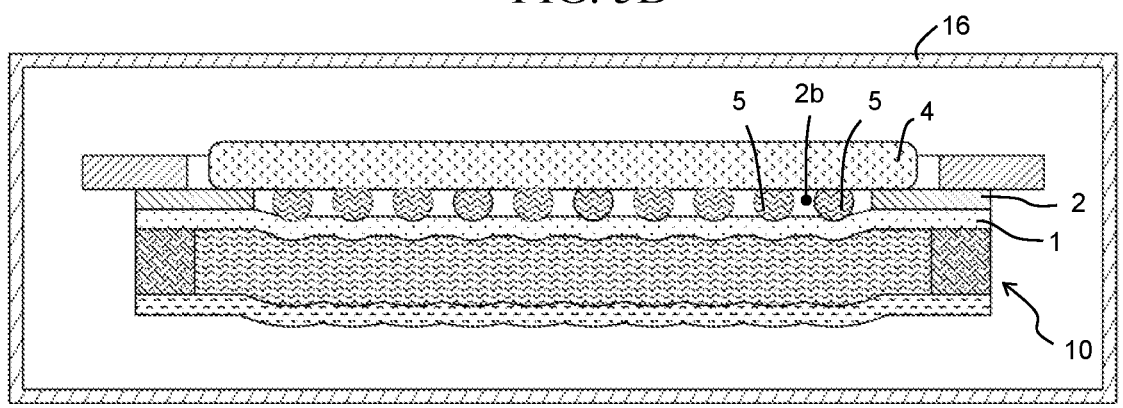

As shown in FIGS. 5B and 5C, in the wafer adhering process, the adhesive sheet 10 is adhered to the outer periphery 4a of the semiconductor wafer 4 under reduced pressure (in the decompression chamber 16) so that the adhesive sheet 10 is in contact with the surface with the convex portions 5 of the semiconductor wafer 4, as in the first embodiment. By adhering the adhesive sheet 10 to the semiconductor wafer 4 under the reduced pressure, sealed spaces 2b enclosed by the semiconductor wafer 4 and the adhesive sheet 10 becomes depressurized state.

Figure 5D:
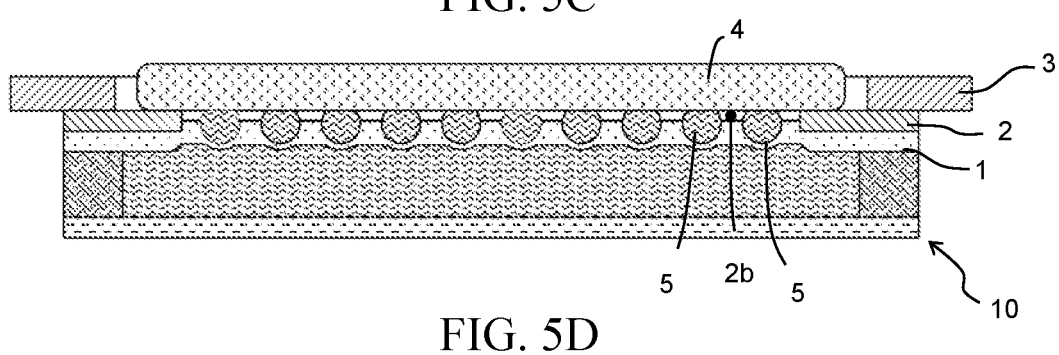

In that state, when the adhesive sheet 10 adhered to the semiconductor wafer 4 is moved from the decompression chamber 16 and exposed to atmospheric pressure, the cushion layer 1 is pushed by the atmospheric pressure into the sealed spaces 2b, as shown in FIG. 5D. As a result, the convex portions 5 are embedded in the cushion layer 1, and the convex portions 5 are protected by the cushion layer 1.

Resin Curing Process

Figure 6A:
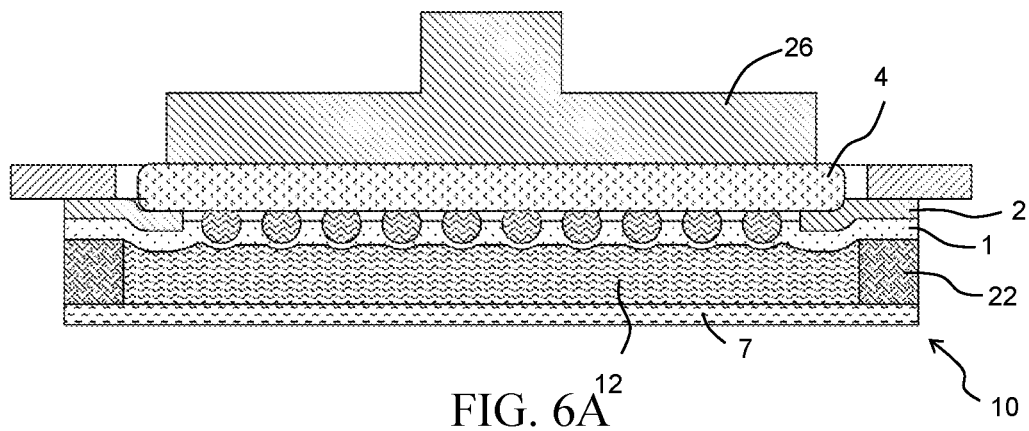
FIGS. 6A to 6D show cross-sectional views for illustrating the method for manufacturing the semiconductor wafer using the adhesive sheet 10 of the second and fourth embodiments of the present invention.
Figure 6B:
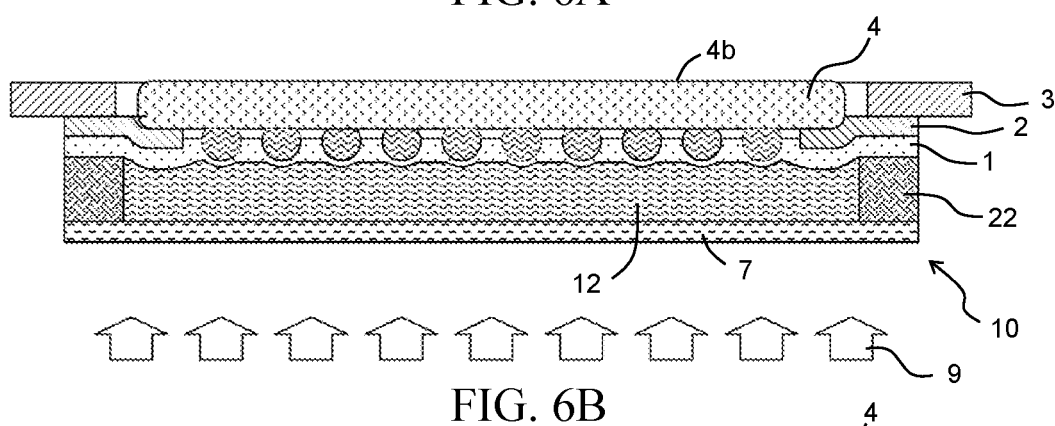

As shown in FIGS. 6A and 6B, in the resin curing process, the curable resin layer 12 is cured in a state where the cushion layer 1 is placed in contact with the curable resin layer 12.

In an example, the curable resin layer 12 can be cured by irradiating energy rays 9 such as ultraviolet rays through the support film 7 to the curable resin layer 12 in a state where the semiconductor wafer 4 is pressed against the curable resin layer 12 using a pressure unit 26. As a result, the curable resin layer 12 becomes the cured resin layer 22, and the cushion layer 1 is stably held. The decompression unit 6 of the first embodiment can be used as the pressure unit 26.

Cutting Process

Figure 6C:
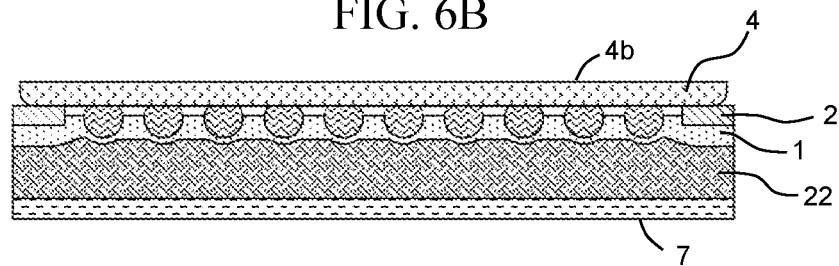

As shown in FIGS. 6B and 6C, in the cutting process, the adhesive sheet 10 is cut along the periphery of the semiconductor wafer 4. As a result, the adhesive sheet 10 adhered to the semiconductor wafer 4 is separated from the ring frame 3.

Grinding Process

As shown in FIG. 6C, the grinding process involves grinding the backside 4b of the semiconductor wafer 4, as in the first embodiment.

Peeling Process

Figure 6D:
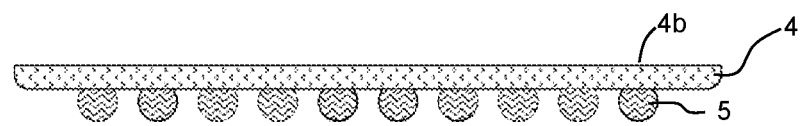
Figure 6D:
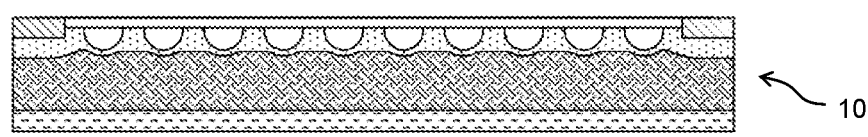

As shown in FIGS. 6C and 6D, in the peeling process, the adhesive sheet 10 is peeled off from the semiconductor wafer 4, as in the first embodiment.

3. Third Embodiment

3-1. Adhesive Sheet

Basic configuration of the adhesive sheet 10 of this embodiment is the same as that of the first embodiment, but the adhesive sheet 10 of this embodiment is a "heated" type that is supposed to be used with heating. The adhesive sheet 10 of this embodiment differs from that of the first embodiment in the thermoplastic resin of the cushion layer 1.

The thermoplastic resin of the cushion layer 1 of this embodiment has a melt flow rate (MFR) of 0.2 to 30 g/10 min. When the MFR is 0.2 g/10 min or more, it has excellent followability to the convex portions 5 and excellent grindability. When the MFR is 30 g/10 min or less, the followability to the convex portions 5 is not too high, resulting in excellent peelability. The MFR is preferably 0.3 to 20 g/10 min. The MFR is measured under the conditions of 125° C./10.0 kg load according to JIS K7210.

Melting point of the thermoplastic resin is 60 to 110° C. When the melting point is 60° C. or more, the followability to the convex portions 5 is not too high, resulting in excellent peelability. When the melting point is 110° C. or less, it has excellent followability to the convex portions 5 and excellent grindability. The melting point is preferably 70 to 90° C. The melting point is measured under the conditions in accordance with JIS K7121.

Thickness of the cushion layer 1 is preferably 50 to 300 μm, more preferably 70 to 250 μm.

The constituent of the thermoplastic resin may be: ionoma resins in which carboxyl groups of single material such as ethylene-methacrylic acid-acrylic ester ternary copolymer, ethylene-methacrylic acid copolymer, and ethylene-acrylic acid copolymer and/or composite material thereof are cross-linked with metal ions such as sodium ions, lithium ions and magnesium ions; soft polypropylene resins blended with styrene-butadiene copolymer rubber, styrene-butadiene styrene block copolymer rubber, styrene-isoprene-styrene block copolymer rubber, ethylene-propylene rubber or the like; low density polyethylene; ethylene-propylene block copolymer; ethylene-propylene random copolymer; ethylene-vinyl acetate copolymer; ethylene-methacrylic acid copolymer; ethylene-loctene copolymer; or polybutene, but is not limited thereto. Among them, the ionoma resin is preferred.

Mass average molecular weight (Mw) of the thermoplastic resin is preferably 10,000 to 1,000,000, and more preferably 50,000 to 500,000.

Softening temperature (JIS K7206) of the thermoplastic resin is preferably 45 to 85° C., more preferably 55 to 75° C.

The melting point (JIS K7121) of the thermoplastic resin is preferably 60 to 110° C., more preferably 80 to 100° C.

The melt flow rate (MFR) (JIS K7210, 125° C./10.0 kg load) of the thermoplastic resin is preferably 0.2 to 30 g/10 min, more preferably 0.3 to 10 g/10 min.

3-2. Method for Manufacturing Semiconductor Wafer

A method for manufacturing a semiconductor wafer using the adhesive sheet 10 of this embodiment will be described. This method includes a frame adhering process, a wafer adhering process, a heating process, a cutting process, a resin curing process, a grinding process, and a peeling process. The order in which these processes are performed is not limited thereto, and the order can be swapped as appropriate. Each process is described below. In the following explanation, the explanations in common with the first embodiment are not repeated. The explanations of the frame adhering process, cutting process, resin curing process, grinding process, and peeling process are the same as in the first embodiment, so they will not be repeated here.

Wafer Adhering Process and Heating Process

As shown in FIGS. 1B and 1C, in the wafer adhering process, the adhesive sheet 10 is adhered to the outer periphery 4a of the wafer 4 under reduced pressure so that the adhesive sheet 10 is in contact with the surface with the convex portions 5 of the semiconductor wafer 4, as in the first embodiment.

In that state, when the adhesive sheet 10 adhered to the semiconductor wafer 4 is moved from the decompression chamber 16 and exposed to atmospheric pressure, the cushion layer 1 is pushed by the atmospheric pressure into the sealed spaces 2b. When the cushion layer 1 is not heated, it is very rigid, and the cushion layer 1 hardly enters the sealed spaces 2b. On the other hand, when the cushion layer 1 is heated to 60 to 150° C. in the heating process, the cushion layer 1 is softened and enters the sealed spaces 2b as shown in FIG. 1D. As a result, the convex portions 5 are embedded in the cushion layer 1, and the convex portions 5 are protected by the cushion layer 1. The ratio of height of the embedded part of the convex portion 5/height of the entire convex portion 5 is preferably 0.2 to 1, more preferably 0.5 to 1, even more preferably 0.8 to 1. Heating temperature of the cushion layer 1 is preferably 80 to 120° C. Heating time of the cushion layer 1 is preferably 3 to 120 seconds, more preferably 5 to 60 seconds.

The heating of the cushion layer 1 may be performed before or after the semiconductor wafer 4 is adhered to the adhesive sheet 10. The heating may be performed in the decompression chamber 16 or outside the decompression chamber 16.

4. Fourth Embodiment 4-1. Adhesive Sheet Basic configuration of the adhesive sheet 10 of this embodiment is the same as that of the second embodiment, but the adhesive sheet 10 of this embodiment is a "heated" type that is supposed to be used with heating. The adhesive sheet 10 of this embodiment differs from that of the first embodiment in the thermoplastic resin of the cushion layer 1, and is the same thermoplastic resin as that described in the third embodiment.

4-2. Method for Manufacturing Semiconductor Wafer

A method for manufacturing the semiconductor wafers using the adhesive sheet 10 of this embodiment will be described. This manufacturing method includes a frame adhering process, a wafer adhering process, a heating process, a resin curing process, a cutting process, a grinding process, and a peeling process. The order in which these processes are performed is not limited thereto, and the order can be swapped as appropriate. Each process will be described below. In the following explanation, the explanations in common with the second embodiment are not repeated. The explanations of the frame adhering process, resin curing process, cutting process, grinding process, and peeling process are the same as in the first embodiment, so they will not be repeated here.

Wafer Adhering Process and Heating Process

As shown in FIGS. 5B and 5C, in the wafer adhering process, the adhesive sheet 10 is adhered to the outer periphery 4a of the wafer 4 under reduced pressure (in the decompression chamber 16) so that the adhesive sheet 10 is in contact with the surface with the convex portions 5 of the semiconductor wafer 4, as in the first embodiment. By adhering the adhesive sheet 10 to the semiconductor wafer 4 under the reduced pressure, sealed spaces 2b enclosed by the semiconductor wafer 4 and the adhesive sheet 10 becomes depressurized state.

In that state, when the cushion layer 1 is heated to 60 to 150° C. and then the adhesive sheet 10 adhered to the semiconductor wafer 4 is moved from the decompression chamber 16 and exposed to atmospheric pressure, the cushion layer 1 is pushed by the atmospheric pressure into the sealed spaces 2*b*, as shown in FIG. 1D. As a result, the convex portions 5 are embedded in the cushion layer 1, and the convex portions 5 are protected by the cushion layer 1.

EXAMPLES

1. Example of an Adhesive Sheet (Non-Heated Type)

Using adhesive sheets 10 with the same configuration as the first embodiment and with the following tensile stresses of thermoplastic resins and viscosities and Shore hardnesses of UV-curable resins, backsides of semiconductor wafers 4 were ground to evaluate bump followability, air bubble contamination, peelability, grindability (TTV), handling performance and comprehensive judgment.

TABLE 1

|  |  | Example |  |  |  |  |  |  |  |  |  |  |  |
|---|---|---|---|---|---|---|---|---|---|---|---|---|---|
|  |  | 1 | 2 | 3 | 4 | 5 | 6 | 7 | 8 | 9 | 10 | 11 | 12 |
| Thermoplastic resin | Tensile stress (N/10 mm) | 2 | 3 | 15 | 30 | 3 | 3 | 3 | 3 | 3 | 3 | 3 | 3 |
| UV-curable resin | Viscosity (mPa · s) | 470 | 470 | 470 | 470 | 110 | 230 | 1270 | 2850 | 580 | 620 | 240 | 220 |
|  | Shore D hardness | 15 | 15 | 15 | 15 | 58 | 44 | 13 | 11 | 5 | 11 | 61 | 72 |
| Evaluation | Bump followability | Great | Great | Great | Good | Great | Great | Great | Great | Great | Great | Great | Great |
|  | Air bubble contamination | Great | Great | Great | Great | Good | Great | Great | Good | Great | Great | Great | Great |
|  | Peelability | Great | Great | Great | Great | Great | Great | Great | Great | Great | Great | Great | Good |
|  | Grindability (TTV) | Great | Great | Great | Great | Good | Great | Great | Good | Good | Great | Great | Great |
|  | Handling performance | Good | Great | Great | Great | Great | Great | Great | Great | Great | Great | Great | Great |
|  | Comprehensive judgment | Good | Great | Great | Good | Good | Great | Great | Good | Good | Great | Great | Good |

TABLE 2

|  |  | Comparative Example | |
|---|---|---|---|
| Table 2 |  | 1 | 2 |
| Thermoplastic resin | Tensile stress (N/10 mm) | 1 | 40 |
| UV-curable resin | Viscosity (mPa · s) | 470 | 470 |
|  | Shore D hardness | 15 | 15 |
| Evaluation | Bump followability | Great | Poor |
|  | Air bubble contamination | Great | Great |
|  | Peel ability | Great | Great |
|  | Grindability (TTV) | Great | Great |
|  | Handling performance | Poor | Great |
|  | Comprehensive judgment | Poor | Poor |

1-1. Manufacturing of Adhesive Sheet 10

Each adhesive sheet 10 of the examples and comparative examples was manufactured by forming an annular adhesive layer 2 having an opening 2*a* on the cushion layer 1. Thermoplastic resin constituting each cushion layer 1 was prepared to have tensile stress shown in Tables 1 and 2. The tensile stress of the thermoplastic resin is a tensile stress of the cushion layer 1 when the cushion layer 1 punched out by using a dumbbell according to JISZ1702 is stretched by 25% at a distance between gauge lines of 40 mm and a tensile speed of 300 mm/min.

The constituent of each thermoplastic resin was ethylene-styrene copolymer, and the tensile stress thereof was varied by changing the content ratio of each constituent unit of ethylene monomer unit and styrene monomer unit. The constituent of the adhesive constituting each adhesive layer 2 was 1,2-hydrogenerated polybutadiene terminated urethane (meth)acrylate.

Thickness of each cushion layer 1 was 50 μm. Thickness of each adhesive layer 2 was 10 μm. Width of each adhesive layer 2 was 37 mm.

1-2. Back Grinding of Semiconductor Wafer

Using each adhesive sheet 10 fabricated above, the backside of each semiconductor wafer 4 was ground by the following method.

First, the adhesive sheet 10 was attached to the ring frame 3. Next, the adhesive sheet 10 was adhered to the outer periphery 4*a* of the wafer 4 in the decompression chamber 16 so that the adhesive sheet 10 was in contact with the surface with the convex portions 5 of the semiconductor wafer 4. The semiconductor wafer 4 had 8 inches in diameter, and 725 μm in thickness, and had 230 μm high bumps (protruding electrodes) formed in an area other than 3.0 mm periphery. Width of the adhering surface where the semiconductor wafer 4 was adhered to the adhesive layer 2 was 2.0 mm. Pressure in the decompression chamber 16 was 100 Pa.

Next, the adhesive sheet 10 to which the semiconductor wafer 4 was adhered was moved from the decompression chamber 16.

Next, each adhesive sheet 10 was cut along the periphery of the respective semiconductor wafer 4, and the ring frame 3 was separated from the respective adhesive sheet 10.

Next, the curable resin 8 was pressed and spread by moving the adhesive sheet 10 in the in-plane direction of the support film 7 in a state where the adhesive sheet 10 faced the curable resin 8 supplied on the support film 7. The curable resins 8 were used with the viscosity and Shore D hardness shown in Table 1. The viscosity of the curable resin 8 before curing was measured using an E-type viscometer at 23° C. and 50 rpm. The Shore D hardness of the curable resin 8 after curing was measured under the conditions of JIS K 6253.

The constituent of the curable resin 8 was composed of 1,2-hydrogenated polybutadiene terminal urethane (meth)acrylate, isobornyl acrylate, and diethylacrylamide, and the viscosity and Shore D hardness were varied by changing each constituent.

Next, the curing resin 8 was cured in a state where the cushion layer 1 was placed in contact with the curable resin 8. The curing resin 8 was cured by irradiating UV light from the support film 7 side to the curing resin so that the integrated light intensity at a wavelength of 365 nm was 2000 mJ/cm$^2$.

Next, the backside of the semiconductor wafer 4 was ground until the thickness of the wafer 4 was 200 µm. The back grinding was performed using a polishing machine (DFG-841 back grinder manufactured by DISCO Corporation).

Peeling Process

Next, each adhesive sheet 10 was peeled off from the respective semiconductor wafer 4.

1-3. Evaluation

The following method was used to evaluate the bump followability, air bubble contamination, peelability, grindability (TTV), handling performance and comprehensive judgment. The evaluation results are shown in Tables 1 and 2.

Bump Followability

The bump followability was evaluated from the rate of followability (rate of followability=(Distance that the cushion layer 1 followed along height of bump/height of bumps)) using the following criteria.
  Great: Rate of followability is 80% or more
  Good: Rate of followability is 71% to 79%.
  Poor: Rate of followability is 70% or less Air Bubble Contamination The air bubble contamination was evaluated based on the number of air bubbles with a diameter of 1 mm or more, using the following criteria.
  Great: Number of air bubbles is 10 or less
  Good: Number of bubbles is 11 to 30
  Poor: Number of bubbles is 31 or more Peelability The peelability was evaluated based on the adhesive strength to the mirror surface of the silicon wafer measured in accordance with JIS Z 0237, using the following criteria.
  Great: Adhesive strength is 1.0 N/20 mm or less
  Good: Adhesive strength is 1.1 to 2.0 N/20 mm
  Poor: Adhesive strength is 2.1 N/20 mm or more Grindability (TTV)

The grindability (TTV: maximum thickness—minimum thickness) was evaluated by measuring the thickness accuracy of the wafer surface using SemDex (thickness accuracy measurement device, ISIS Co., Ltd.), using the following criteria.
  Great: TTV 5 µm or less
  Good: TTV 6 to 15 µm
  Poor: TTV 16 µm or more Handling Performance The handling performance was evaluated based on difference between the set width and the measured width of the adhering surface having the adhesive sheet 10 attached to the semiconductor wafer 4, using the following criteria.
  Great: Set width—width of adhering surface is −0.5 mm or more to +0.5 mm or less
  Good: Set sidth—width of adhering surface is −1.0 mm to −0.5 mm or +0.5 mm to +1.0 mm
  Poor: Set width—width of adhering surface is less than −1.0 mm or more than +1.0 mm Comprehensive Judgment The comprehensive judgment was based on the following criteria.
  Great: All items are "Great".
  Good: At least one item is "Good" and no item is"Poor".
  Poor: At least one item is "Poor".

1-4. Results

All the examples showed excellent results in all the evaluation items. On the other hand, all the comparative examples did not show satisfactory results in at least one of the evaluation items.

2. Example of Adhesive Sheet (Heated Type)

Using adhesive sheets 10 with the same configuration as the third embodiment and with the following MFRs and melting points of the thermoplastic resins and the viscosities and Shore hardnesses of the UV-curable resins, backsides of semiconductor wafers 4 were ground to evaluate bump followability, air bubble contamination, peelability, grindability (TTV) and comprehensive judgment.

TABLE 3

| | | Example | | | | | | | | | | | | | | | |
|---|---|---|---|---|---|---|---|---|---|---|---|---|---|---|---|---|---|
| | | 13 | 14 | 15 | 16 | 17 | 18 | 19 | 20 | 21 | 22 | 23 | 24 | 25 | 26 | 27 | 28 | 29 |
| Thermoplastic resin | MFR (g/10 min) | 0.2 | 0.3 | 11 | 18 | 28 | 3 | 5 | 7 | 2 | 7 | 7 | 7 | 7 | 7 | 7 | 7 | 7 |
| | Melting point (° C.) | 89 | 86 | 84 | 83 | 88 | 62 | 72 | 92 | 107 | 84 | 84 | 84 | 84 | 84 | 84 | 84 | 84 |
| UV-curable resin | Viscosity (mPa · s) | 470 | 470 | 470 | 470 | 470 | 470 | 470 | 470 | 470 | 110 | 230 | 1270 | 2850 | 580 | 620 | 240 | 220 |
| | Shore D hardness | 15 | 15 | 15 | 15 | 15 | 15 | 15 | 15 | 15 | 58 | 44 | 13 | 11 | 5 | 11 | 61 | 72 |
| Evaluation | Bump followability | Good | Great | Great | Great | Great | Great | Great | Great | Good | Great | Great | Great | Great | Great | Great | Great | Great |
| | Air bubble contamination | Great | Great | Great | Great | Great | Great | Great | Great | Great | Good | Great | Great | Good | Great | Great | Great | Great |
| | Peelability | Great | Great | Great | Great | Good | Good | Great | Great | Great | Great | Great | Great | Great | Great | Great | Great | Good |
| | Grindability (TTV) | Good | Great | Great | Great | Great | Great | Great | Good | Good | Great | Great | Good | Good | Great | Great | Great | Great |
| | Comprehensive judgment | Good | Great | Great | Great | Good | Good | Great | Great | Good | Good | Great | Great | Good | Good | Great | Great | Good |

TABLE 4

|  | Table 4 | Comparative Example | | | |
|---|---|---|---|---|---|
|  |  | 3 | 4 | 5 | 6 |
| Thermoplastic resin | MFR (g/10 min) | 0.1 | 33 | 1 | 25 |
|  | Melting point (° C.) | 90 | 91 | 53 | 114 |
| UV-curable resin | Viscosity (mPa · s) | 470 | 470 | 470 | 470 |
|  | Shore D hardness | 15 | 15 | 15 | 15 |
| Evaluation | Bump followability | Poor | Great | Great | Poor |
|  | Air bubble contamination | Great | Great | Great | Great |
|  | Peelability | Great | Poor | Poor | Great |
|  | Grindability (TTV) | Poor | Great | Great | Poor |
|  | Comprehensive judgment | Poor | Poor | Poor | Poor |

2-1. Manufacturing of Adhesive Sheet 10

Each adhesive sheet 10 of the examples and comparative examples was manufactured by forming an annular adhesive layer 2 having an opening 2a on the cushion layer 1. The MFR and melting point of thermoplastic resin constituting each cushion layer 1 are listed in Tables 3 and 4.

The constituent of each thermoplastic resin was metal ion-crosslinked ethylene-methacrylic acid copolymer, and the MFR and melting point were varied by changing the copolymer constituent and mass average molecular weight.

The constituent of the adhesive constituting each adhesive layer 2 is 1,2-hydrogenerated polybutadiene terminated urethane (meth)acrylate.

Thickness of each cushion layer 1 was set 150 μm. Thickness of each adhesive layer 2 was 10 μm. Width of each adhesive layer 2 was 37 mm.

2-2. Back Grinding of Semiconductor Wafer

Using each adhesive sheet 10 fabricated above, the backside of each semiconductor wafer 4 was ground by the following method.

First, the adhesive sheet 10 was attached to the ring frame 3. Next, the adhesive sheet 10 was adhered to the outer periphery 4a of the wafer 4 in the decompression chamber 16 so that the adhesive sheet 10 was in contact with the surface with the convex portions 5 of the semiconductor wafer 4. The semiconductor wafer 4 had 8 inches in diameter, and 725 μm in thickness, and had 230 μm high bumps (protruding electrodes) formed in an area other than 3.0 mm periphery. Width of the adhering surface where the adhesive layer 2 was adhered to the semiconductor wafer 4 was 2.0 mm. Pressure in the decompression chamber 16 was 100 Pa. In the decompression chamber 16, the cushion layers 1 were heated to 100° C.

Next, the adhesive sheet 10 to which the semiconductor wafer 4 was adhered was moved from the decompression chamber 16.

Next, the adhesive sheet 10 was cut along the periphery of the respective semiconductor wafer 4, and each ring frame 3 was separated from the respective adhesive sheet 10.

Next, the curable resin 8 was pressed and spread by moving the adhesive sheet 10 in the in-plane direction of the support film 7 in a state where the adhesive sheet 10 faced the curable resin 8 supplied on the support film 7. The curable resins 8 were used with the viscosity and Shore D hardness shown in Table 3. The viscosity of the curable resin 8 before curing was measured using an E-type viscometer at 23° C. and 50 rpm. The Shore D hardness of the curable resin 8 after curing was measured according to JIS K 6253.

The constituent of the curable resin 8 was composed of 1,2-hydrogenated polybutadiene terminal urethane (meth) acrylate, isobornyl acrylate, and diethylacrylamide, and the viscosity and Shore D hardness were varied by changing each constituent.

Next, the curing resin 8 was cured in a state where the cushion layer 1 was placed in contact with the curable resin 8. The curing resin 8 was cured by irradiating UV light from the support film 7 side to the curing resin so that the integrated light intensity at a wavelength of 365 nm was 2000 mJ/cm$^2$.

Next, the backside of the semiconductor wafer 4 was ground until the thickness of the wafer 4 was 200 μm. The back grinding was performed using a polishing machine (DFG-841 back grinder manufactured by DISCO Corporation).

Peeling Process

Next, each adhesive sheet 10 was peeled off from the respective semiconductor wafer 4.

2-3. Evaluation

The following method was used to evaluate the bump followability, air bubble contamination, peelability, grindability (TTV) and comprehensive judgment. The evaluation criteria are as explained in "1-3. Evaluation". The evaluation results are shown in Tables 3 and 4.

2-4. Results

All the examples showed excellent results in all the evaluation items. On the other hand, all the comparative examples did not show satisfactory results in at least one of the evaluation items.

EXPLANATION OF THE CODE

1: Cushion layer
2: Adhesive layer
2a: Opening
2b: Sealed space
3: Ring frame
3a: Opening
4: Semiconductor wafer
4a: Outer periphery
4b: Backside
5: Convex portion
6: Decompression unit
6a: Decompression hole
7: Support film
8: Curable resin
9: Energy ray
10: Adhesive sheet
12: Curable resin layer
13: Release liner
14: Mask
16: Decompression chamber
22: Cured resin layer
26: Pressure unit

What is claimed is:

1. An adhesive sheet for back grinding of a semiconductor wafer having convex portions, comprising a non-adhesive cushion layer and an adhesive layer provided on the cushion layer,
   wherein the adhesive layer comprises an opening with a diameter smaller than a diameter of the semiconductor wafer,
   the adhesive layer is configured to be attached to an outer periphery of the semiconductor wafer so that the convex portions of the semiconductor wafer are placed in the opening, whereby the convex portions are protected by the cushion layer in a state where the semiconductor wafer is attached to the adhesive layer, and at least one of the following conditions (1) and (2) is satisfied:
(1) tensile stress of the cushion layer punched out by using a dumbbell according to JISZ1702 is 2 to 30N/10 mm when the punched-out cushion layer is stretched by 25% at a distance between gauge lines of 40 mm and a tensile speed of 300 mm/min; and
(2) the cushion layer is composed of a thermoplastic resin with a melt flow rate of 0.2 to 30 g/10 min under 125° C./10.0 kg load according to JISK7210 and a melting point of 60 to 110° C.

2. The adhesive sheet according to claim 1, wherein the convex portions are protected by being embedded in the cushion layer.

3. The adhesive sheet according to claim 1, wherein the adhesive layer is attached the semiconductor wafer under reduced pressure.

4. The adhesive sheet according to claim 1, wherein a thickness of the cushion layer is 50 to 300 μm and thickness of the adhesive layer is 1 to 100 μm.

5. The adhesive sheet according to claim 1, further comprising a curable resin layer containing a curable resin and a support film,
wherein the curable resin and the support film are laminated onto the cushion layer side of the adhesive sheet.

6. The adhesive sheet according to claim 5, wherein the curable resin has a viscosity of 100 to 3,000 mPa·s before curing and Shore D hardness of 5 to 72 after curing.

7. The adhesive sheet according to claim 5, wherein when a height of the convex portions in μm is Td, a thickness of the curable resin is (Td+20) to (Td+200) μm.

8. The adhesive sheet according to claim 5, wherein the curable resin layer is provided on an opposite side of a surface of the adhesive sheet provided with the adhesive layer and between the support film and a surface of the cushion layer.

9. The adhesive sheet according to claim 8, further comprising a cured resin layer so as to surround the curable resin layer.

10. A method for manufacturing a semiconductor wafer using the adhesive sheet according to claim 1, comprising
the adhesive sheet to a ring frame,
adhering the adhesive sheet to a surface of the semiconductor wafer having the convex portions on a periphery of the semiconductor wafer under reduced pressure,
cutting the adhesive sheet along the periphery of the semiconductor wafer,
curing a curable resin in a state where the cushion layer is in contact with the curable resin,
grinding a backside of the semiconductor wafer,
peeling off the adhesive sheet from the semiconductor wafer,
at least one of the following conditions (A) and (B) is satisfied:
(A) the above condition (1) is satisfied; and
(B) the above condition (2) is satisfied, and
the method further comprises heating the cushion layer to 60 to 150° C. when the condition (2) is satisfied.

11. The method for manufacturing the semiconductor wafer according to claim 10, wherein tensile stress of the cushion layer punched out by using a dumbbell according to JISZ1702 is 2 to 30 N/10 mm when the punched-out cushion layer is stretched by 25% at a distance between gauge lines of 40 mm and a tensile speed of 300 mm/min.

12. The method for manufacturing the semiconductor wafer according to claim 10, wherein the curable resin has a viscosity of 100 to 3,000 mPa·s before curing and Shore D hardness of 5 to 72 after curing.

13. The method for manufacturing the semiconductor wafer according to claim 10 further comprising, between the process of adhering the adhesive sheet to the surface of the semiconductor wafer and the process of curing the curable resin, pressing and spreading the curable resin by moving the adhesive sheet while the adhesive sheet faces the curable resin supplied on a support film.

* * * * *